United States Patent [19]

Delorme

[11] Patent Number: 5,553,091
[45] Date of Patent: Sep. 3, 1996

[54] OPTICAL COMPONENT HAVING A PLURALITY OF BRAGG GRATINGS AND PROCESS FOR THE PRODUCTION OF SAID COMPONENTS

[75] Inventor: Franck Delorme, Villejuif, France

[73] Assignee: France Telecom Etablissement Autonome De Droit Public, Paris, France

[21] Appl. No.: 349,567

[22] Filed: Dec. 5, 1994

[30] Foreign Application Priority Data

Dec. 6, 1993 [FR] France ................... 93 14588

[51] Int. Cl.⁶ ............................. H01S 3/19; H01S 3/082
[52] U.S. Cl. .................... 372/50; 372/96; 372/102; 385/37
[58] Field of Search ............................. 372/96, 102, 50, 372/20, 45, 46; 385/10, 37

[56] References Cited

U.S. PATENT DOCUMENTS

| | | | |
|---|---|---|---|
| 3,814,498 | 6/1974 | Tomlinson, III et al. | 385/37 |
| 4,445,218 | 4/1984 | Coldren | 372/44 |
| 4,885,753 | 12/1989 | Oaki et al. | 372/45 |
| 4,932,032 | 6/1990 | Koch et al. | 372/45 |
| 4,955,030 | 9/1990 | Menigaux et al. | 372/44 |
| 5,109,386 | 4/1992 | Bradley | 372/50 X |
| 5,208,824 | 5/1993 | Tsang | 372/96 |
| 5,274,660 | 12/1993 | Abe | 372/96 |
| 5,276,702 | 1/1994 | Meliga | 372/96 |
| 5,329,542 | 7/1994 | Westbrook | 372/96 |
| 5,363,399 | 11/1994 | Yagi | 372/96 |
| 5,384,797 | 1/1995 | Welch et al. | 372/50 X |

FOREIGN PATENT DOCUMENTS

| | | |
|---|---|---|
| 2684498 | 6/1993 | France . |
| 59-031088 | 2/1984 | Japan . |
| 58-196088 | 2/1984 | Japan . |
| 60-247986 | 12/1985 | Japan . |
| 61-014787 | 1/1986 | Japan . |
| 61-191093 | 8/1986 | Japan . |
| 63-73585 | 8/1988 | Japan . |
| 1-124279 | 5/1989 | Japan . |
| 2106706 | 4/1983 | United Kingdom . |

OTHER PUBLICATIONS

A. Takemoto et al., "Dependence of characteristics of buried grating type DFB laser diodes on the coupling constant", Technical Digest, 12 IEEE International Semiconductor Laser Conference, Sep. 92, Davos, Switzerland, paper E–3.
W. Streifer et al., "Effect of external reflectors on longitudinal modes of distributed feedback lasers", IEEE J. Quantum Electron., QE–11(Apr. 1975), p. 154.
K. Utaka et al., "Analysis of quarter wave shifted DGB lasers", Electron., Lett., 20, (Feb. 1984), p. 326.
H. Kogelnik et al., "Coupled wave theory of distributed feedback lasers", J. Appl. Phys. 43 (May 1972), p. 2327.
Y. Yoshikuni et al., "Broadly tunable distributed Bragg reflector lasers with a multiple–phase–shift super-structure grating", paper TuC2, p. 8 Proceedings OFC/looC'93, San Jose, USA., 21–26 Feb. 1993. IEEE Photonics Techn. Lett., vol. 4, No. 4, Apr. 1992.
R. C. Alferness et al., "Broadly tunable InGaAsP/InP laser made based on vertical coupler filter with 57 nm tuning range", Appl. Phys. Letters, vol. 60, No. 26, 29 Jun. 1992.

(List continued on next page.)

*Primary Examiner*—Rodney B. Bovernick
*Assistant Examiner*—Hemang Sanghavi
*Attorney, Agent, or Firm*—Pearne, Gordon, McCoy & Granger

[57] ABSTRACT

Optical component having a plurality of Bragg gratings and process for the production of said component.

According to the invention, an optical component is formed comprising a light guide and Bragg gratings which are formed in the guide and have predetermined Bragg wavelengths. This guide comprises a single diffraction grating (16) and zones (24, 26, 28, 30) associated with the Bragg gratings and. The zone have optical indices chosen so as to obtain, in cooperation with the diffraction grating, the Bragg wavelengths.

8 Claims, 3 Drawing Sheets

OTHER PUBLICATIONS

Y. Tohmori et al., "Broad range wavelength tunable superstructure garting (SSG) DBR lasers", IEEE Journal of Quantum Electronics, vol. 29, No. 6, Jun. 1993, New York, US, pp. 1817–1823.

Y. Kotaki et al. "Wavelength tunable DFB and DBR lasers for coherent optical fibre communications", IEEE Proceedings–J; vol. 138, No. 2, Apr. 1991.

Y. Nakano et al., Appl. Phys. Lett., 55, (May 1989), p. 1606; same authors: Extended Anstracts, 1988 International Conference on Solid State Devices and Materials, Tokyo, 1988, paper D–4–4.

B. Borchert et al., IEEE Photon, Technol. Lett., 3 (1991), p. 955.

W. T. Tsang et al., IEEE Photon, Technol. Lett., 4, (May 1992), p. 212.

K. Tada, "Gain coupled DFB lasers", Technical Digest, OFC/IOOC'93, San Diego, paper ThB1 (invited). (This reference was also cited in the French Search Report.)

K. Kudo et al., "Reduction of effective linewidth enhancement factor of DFB laser with complex coupling coefficients", IEEE Photon. Technol. Lett., 4 (1992), p. 531.

Y. Luo et al., "Fabrication and characteristics of gain coupled DFB semiconductor lasers with a corrugated active layer", IEEE J. Quantum Electron., 7, (Jun. 1991), p. 1724.

J. Charil et al., "Extremely low threshold operation of 1.5 μm GaInAsP/InP buried ridge stripe laser", Electron, Lett. 25, (Oct. 1989), p. 1477.

C. Kazmierski et al., "Universal iron behavior in Zn–, Cd–and Be–doped p–type InP", J. of crystal growth 116 (1992), p. 75.

M. T. Camargo Silva et al., "MMIC Based Optical Modulator Design", 1992 IEEE MTT–S International Microwave Symposium Digest, New York, pp. 571–574.

Koch, Thomas L., "Novel Laser Devices", Proceedings of the 13th IEEE International Semiconductor Laser Conference, Sep. 21–25, 1992, Takamatsu, Japan.

IEEE Photonics Techn. Lett., vol. 4, No. 4, Apr. 1992, L. A. Wang et al: "Integrated Four–Wavelength DFB Laser Array with 10 Gb/s Speed and 5 nm Continous Tuning Range".

Proceedings OFC/IOOC'93, Paper PD23, p. 95, San Jose, USA, pp. 21–26, Feb. 1993, T. L. Koch et al: "Incoherent Contact–Print Grating Technology for WDM Laser Sources".

IEEE Photon. Technol. Lett., vol. 2, No. 8, Aug. 1990, pp. 529–530, M. Oaki et al.: "Corrugation–Pitch–Modulated MQW–DFB Laser with Narrow Spectral Linewidth (170 kHz)".

Proceedings 13th IEEE Int'l. Semicon. Laser Conf., Paper 6, Sep. 21–25, 1992, Takamatsu, Japan, pp. 268–269, Y. Tohmori et al: "Ultrawide Wavelength Tuning with Single Longitudinal Mode By Super Structure Grating (SSG) DBR Lasers".

OPTICAL COMPONENT HAVING A PLURALITY OF BRAGG GRATINGS AND PROCESS FOR THE PRODUCTION OF SAID COMPONENTS

BRIEF DESCRIPTION OF THE DRAWINGS

The present invention relates to an optical component having a plurality of Bragg gratings, as well as to a process for the production of said component.

The invention more particularly applies to the production of any optical component requiring several Bragg gratings, such as e.g. certain lasers and certain filters.

The invention more particularly applies to the production of Bragg gratings for multi-wavelength laser transmitters or for monofrequency laser transmitters using such gratings.

The invention inter alia applies to the obtaining of Bragg gratings intended for multi-wavelength transmitters formed from monofrequency lasers, such as e.g. laser arrays having distributed Bragg reflectors or distributed feedback laser arrays or DFB laser arrays.

At present for producing semiconductor monofrequency laser arrays, e.g. DFB or DBR laser arrays transmitting at different wavelengths, it is necessary to have the same number of diffraction gratings as there are wavelengths. In this way e.g. there are 16 diffraction gratings having different pitch spacings in order to obtain 16 wavelengths.

These gratings are produced either by lithography using an ion beam, as can be gathered from the following document:

(1) L. A. Wang et al: "Integrated Four-Wavelength DFB Laser Array with 10 Gb/s Speed and 5 nm Continuous Tuning Range", IEEE Photonics Techn. Lett., vol. 4, no. 4, April 1992, or by holographic exposure, or by using a phase mask etched by an ion beam, as can be gathered from the following document:

(2) T. L. Koch et al: "Incoherent Contact-Print Grating Technology for WDM Laser Sources", paper PD23, p. 95, Proceedings OFC/IOOC'93, San Jose, USA, 21–26 Feb. 1993.

An advantage of ion beam lithography is the possibility of etching on the same plate diffraction gratings having different pitch spacings.

However, the considerable amount of time required for the etching of the various gratings (said time increasing with the area of the plate and the desired number of wavelengths) significantly limits the use of said method, particularly in industry.

The holographic method makes it possible to rapidly treat large areas, but only permits the etching of a single diffraction grating at once.

The etched phase mask method has the advantage of permitting the exposure or irradiation of large areas and the obtaining of diffraction gratings with different spacings, but requires the production of different masks for each variation in the number of wavelengths and on the value of the spacing of said wavelengths.

SUMMARY OF THE INVENTION

The present invention aims at obviating the aforementioned disadvantages by proposing an optical component having a plurality of Bragg gratings, which is much simpler to manufacture than the aforementioned components having several gratings, as well as a process for the production of said component, which is much simpler to perform than the aforementioned processes.

The invention e.g. makes it possible to produce on the same plate having a large area and in rapid manner, gratings having different pitch spacings, as well as the easy control of the number of wavelengths and the spacing between said wavelengths.

As has been shown hereinbefore, the invention also applies to the production of gratings for monofrequency lasers each using several gratings, such as e.g. lasers of the corrugation pitch modulated distributed feedback type, as described in the following document:

(3) M. Okai et al: "Corrugation-Pitch-Modulated MQW-DFB Laser with Narrow Spectral Linewidth (170 kHz)", IEEE Photon. Technol. Lett., vol. 2, no. 8, pp. 529–530, August 1990, and lasers of the distributed Bragg reflector type, as referred to in the following document:

(4) Y. Tohmori et al: "Ultrawide Wavelength Tuning with Single Longitudinal Mode by Super Structure Grating (SSG) DBR Lasers", Proceedings 13th IEEE International Semiconductor Laser Conference, paper 06, pp. 268–269, Takamatsu, Japan, 21–25 Sep. 1992.

In this application of the invention, there is a need for a laser structure longitudinally provided with several Bragg gratings.

The lasers referred to in documents (3) and (4) are not easy to manufacture.

The present invention also obviates this disadvantage by proposing an optical component having a much simpler structure and which is easier to manufacture.

In this aspect of the invention, it is possible to treat large surfaces and easily control the different Bragg wavelengths necessary.

In all cases, the optical component according to the invention only requires a single diffraction grating, which is very advantageous compared with the optical components referred to hereinbefore and which require several diffraction gratings. Thus, in the present invention, a single diffraction grating is formed, no matter what the number of Bragg gratings of the structure which it is wished to produce.

More specifically, the present invention relates to an optical component comprising a light guide and a plurality of Bragg gratings formed in said light guide and which respectively have predetermined Bragg wavelengths, said component being characterized in that the light guide comprises a single diffraction grating and a plurality of zones respectively associated with the Bragg gratings and whereof the respective optical indices are chosen so as to obtain, in cooperation with said diffraction grating, the said Bragg wavelengths, each zone inducing a local modification of the effective optical index of the guide, at least one of said zones being a stack of at least two layers of materials having different optical indices.

According to a first embodiment of the invention, said zones form parallel rows oriented parallel to the propagation direction of the light in the guide and consequently make it possible to obtain parallel Bragg gratings.

According to a special embodiment corresponding to the latter case, the light guide comprises a main guidance zone in which essentially propagates the light and in contact with which are placed said zones, said zones being alternate stacks of a first layer and a second layer, which are respectively made from materials having different optical indices and the number of layer alternations decreases from one end row to the other end row.

According to a second embodiment of the invention, said zones form parallel rows oriented perpendicular to the light propagation direction in the guide and thus make it possible to obtain Bragg gratings in series (along the light propagation axis).

According to a special embodiment corresponding to the latter case, the light guide comprises a main guidance zone in which is essentially propagated the light and, on either side of said main guidance zone, confinement zones and in one of said confinement zones is provided at least one layer made from a material having a different optical index to that of the material constituting said confinement zone and said layer is parallel to the main guidance zone and limited, in the light propagation direction, to a portion facing the centre of the main guidance zone.

The present invention also relates to a process for the production of an optical component comprising a light guide and a plurality of Bragg gratings formed in the light guide and which respectively have predetermined Bragg wavelengths, said process being characterized in that formation takes place of a light guide incorporating a single diffraction grating and a plurality of zones respectively associated with the Bragg gratings and whose respective optical indices are chosen so as to obtain, in cooperation with said diffraction grating, the said Bragg wavelengths, each zone inducing a local modification of the effective optical index of the guide and for this purpose:

a light confinement layer is formed on a substrate, the diffraction grating is formed on said confinement layer, on said diffraction grating is formed a main guidance zone intended essentially for the guidance of the light, on said main guidance zone is formed an alternate stack of a first layer and a second layer respectively made from materials having different optical indices, these layers are locally eliminated so as to obtain parallel rows of alternate stacks of the first and second layers, said rows being oriented parallel to the light propagation direction in the guide and constituting the said zones, the number of layer alternations decreasing from one end row to the other end row and the confinement of the guide is completed.

The present invention also relates to a process for the production of an optical component comprising a light guide and a plurality of Bragg gratings formed in the light guide and which respectively have predetermined Bragg wavelengths, said process being characterized in that a light guide is formed having a single diffraction grating and a plurality of zones respectively associated with the Bragg gratings and whose respective optical indices are chosen so as to obtain, in cooperation with said diffraction grating, the said Bragg wavelengths, each zone inducing a local modification of the effective optical index of the guide and for this purpose:

on a substrate is formed an alternate stack of a first layer and a second layer respectively made from materials having different optical indices, local elimination takes place of said layers so as to obtain parallel rows of alternate stacks of first and second layers, said rows being oriented parallel to the light propagation direction in the guide and constituting the said zones, the layer alternation number decreasing from one end row to the other end row, on said zones is formed a main guidance zone for essentially guiding the light, the diffraction grating is formed on said main guidance zone and the confinement of the guide is completed.

The present invention also relates to a process for the production of an optical component comprising a light guide and a plurality of Bragg gratings formed in the light guide and which respectively have predetermined Bragg wavelengths, said process being characterized in that a light guide is formed having a single diffraction grating and a plurality of zones respectively associated with the Bragg gratings and whose respective optical indices are chosen so as to obtain, in cooperation with said diffraction grating, the said Bragg wavelengths, each zone inducing a local modification of the effective optical index of the guide and for this purpose:

on a substrate is formed a light confinement layer, the diffraction grating is formed on said confinement layer, on said diffraction grating is formed a main guidance zone for essentially guiding the light, another light confinement layer is formed on the main guidance zone, on said other confinement layer is formed a supplementary layer, whose optical index is different from that of said confinement layer, said supplementary layer is eliminated, in accordance with the light propagation direction, except in a portion facing the centre of the main guidance zone and the confinement of the guide is completed.

The present invention also relates to a process for the production of an optical component comprising a light guide and a plurality of Bragg gratings formed in the light guide and which respectively have predetermined Bragg wavelengths, said process being characterized in that a light guide is formed having a single diffraction grating and a plurality of zones respectively associated with the Bragg gratings and whose respective optical indices are chosen so as to obtain, in cooperation with said diffraction grating, the said Bragg wavelengths, each zone inducing a local modification of the effective optical index of the guide and for this purpose:

a light confinement layer is formed on a substrate, on said confinement layer is formed a supplementary layer, whose optical index is different from that of said confinement layer, said supplementary layer is eliminated in the light propagation direction, except in a portion facing the centre of the main guidance zone, on the thus obtained structure is formed another confinement layer made from the same material as said confinement layer, on said other confinement layer is formed a main guidance zone for essentially guiding the light, the diffraction grating is formed on said main guidance zone and the confinement of the guide is completed.

Preferably, the diffraction grating is formed by a holographic exposure method.

BRIEF DESCRIPTION OF THE DRAWINGS

The invention is described in greater detail hereinafter relative to non-limitative embodiments and with reference to the attached drawings, wherein show.

DETAILED DESCRIPTION OF PREFERRED EMBODIMENTS

As has been shown hereinbefore, the invention applies to the production of Bragg gratings for monofrequency semiconductor laser arrays. Consideration will be given hereinafter to the production of said gratings on a passive optical guide. However, the invention also applies to the production of such gratings on an active optical guide.

These gratings formed on a passive optical guide are directly usable for obtaining laser structure of the DBR type. However, they could also be used as optical filters.

Figure 1:
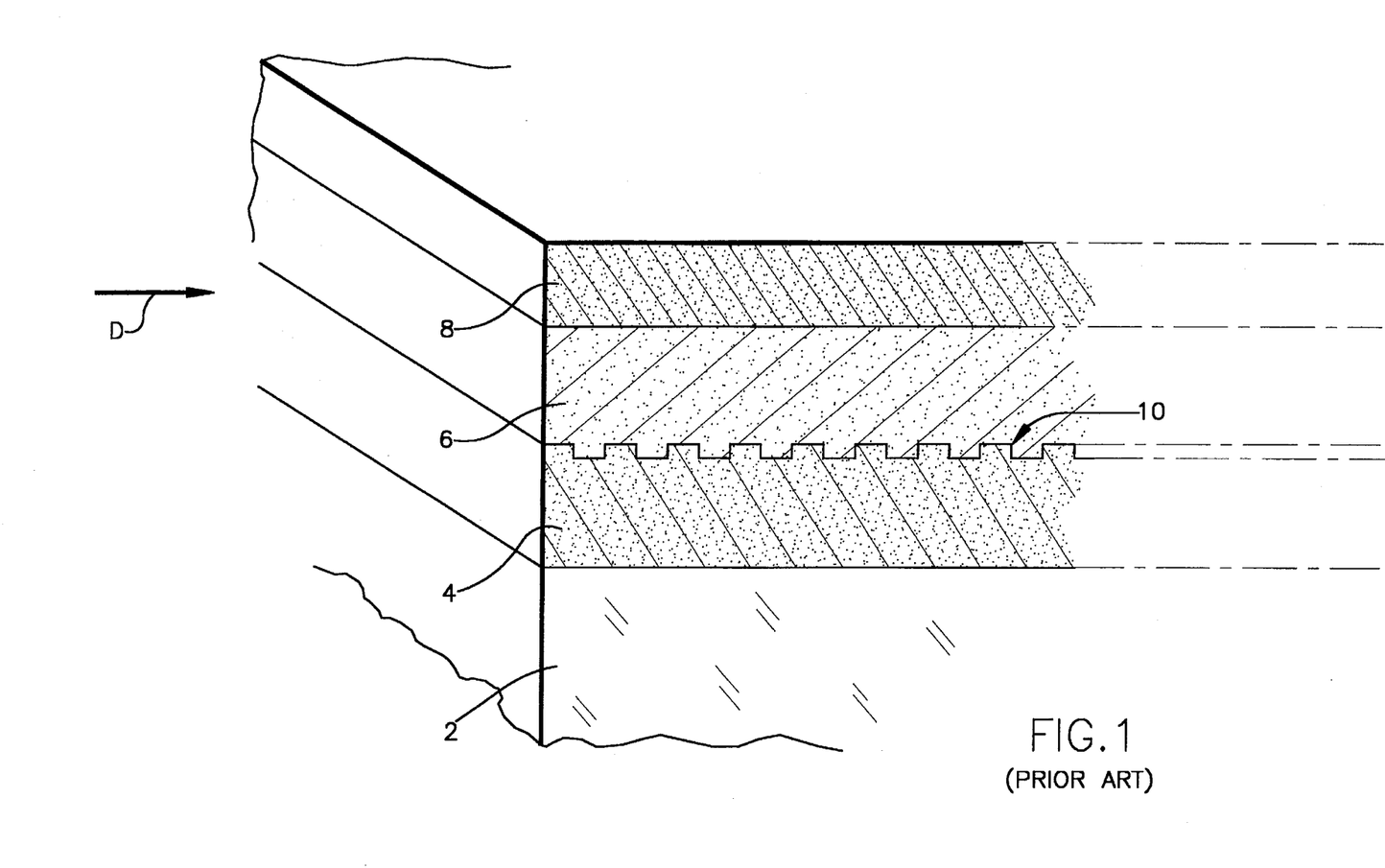
FIG. 1 A diagrammatic view of a known, passive optical guide.

FIG. 1 shows in longitudinal section (in the light propagation direction D), a known, passive optical guide provided with a diffraction grating. More specifically, the passive optical guide diagrammatically shown in FIG. 1 successively comprises on a substrate 2, a first light confinement layer 4, a main guidance zone 6 for said light in which the light essentially propagates, and a second light confinement zone 8.

The confinement zones 4 and 8 have refractive indices below that of the guidance zone 6.

The optical guide of FIG. 1 also comprises a diffraction grating 10 formed on the confinement zone 4 and on which rests the guidance zone 6.

Thus, there is a Bragg grating constituted by the association of the diffraction grating 10 and the main guidance zone 6. This Bragg grating is characterized by a Bragg wavelength $\lambda B$ linked with the effective optical index Neff of the guide (complete stack), as well as the pitch spacing $\Lambda$ of the diffraction grating and to the order p of said diffraction grating by the following formula:

$$\lambda B = \Lambda \cdot 2 Neff/p.$$

All known methods propose, for obtaining different Bragg wavelengths (and therefore different transmission lengths of lasers in the case of an application to obtaining DBR or DFB type lasers), the formation of the same number of parallel diffraction gratings as desired wavelengths, in association with a light guide having a given, effective optical index.

Thus, with these known methods, a diffraction grating of pitch spacing $\Lambda 1$ corresponds to a transmission wavelength $\lambda 1$, a diffraction grating of pitch spacing $\Lambda 2$ corresponds to a transmission wavelength $\lambda 2$, etc.

According to the present invention, only a single diffraction grating is produced and which therefore has a predetermined pitch spacing (preferably by holographic exposure, so that only a single holographic exposure is required) and local modification takes place to the effective index of the guide so as to obtain the different desired wavelengths.

Thus, formation takes place of the same number of different, effective optical indices as required laser transmission wavelengths (or more generally different Bragg wavelengths).

Thus, according to the invention, a zone of effective index Neff1 is made to correspond with a Bragg wavelength $\lambda B1$ (and the corresponding transmission wavelength $\lambda 1$), a zone of effective index Neff2 is made to correspond with a Bragg wavelength $\lambda 2$ (and the corresponding transmission wavelength $\lambda 2$), etc.

Figure 2:
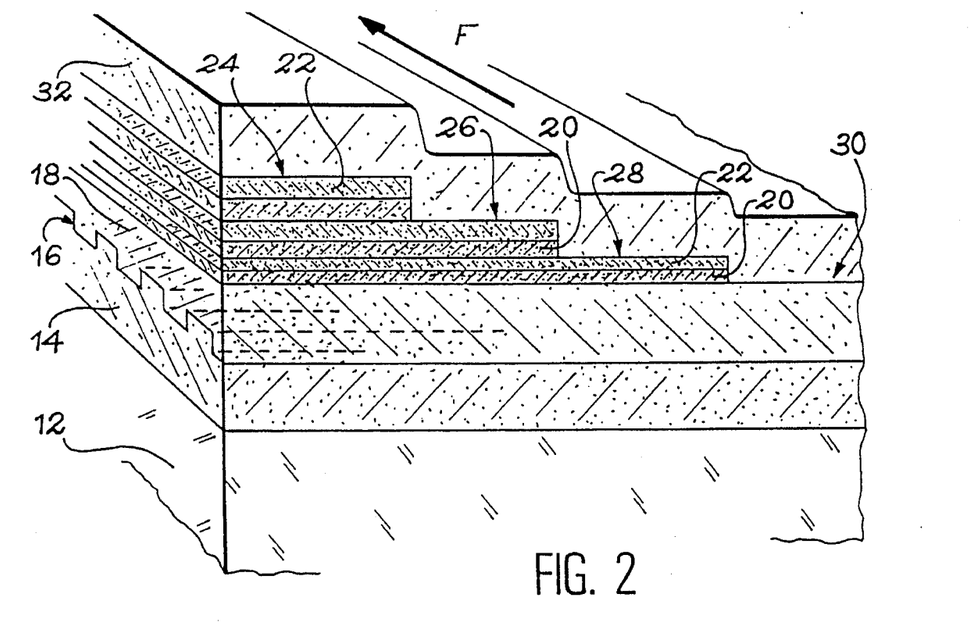
FIG. 2 A diagrammatic, partial view of a passive optical guide according to the invention.

FIG. 2 is a partial, diagrammatic view of a passive optical guide according to the invention shown in cross-section, the light propagating in the direction indicated by the arrow F in FIG. 2, said guide implementing the principle referred to hereinbefore.

In this guide according to the invention, to obtain the variations of the effective index of the guide, to the main guidance part, whose thickness is designated e and whose optical index is designated n, are added alternate layers of a first material and a second material having different optical indices from one another.

The number of pairs of different layers formed in this way determines the number of different wavelengths which can be obtained on the same semiconductor wafer.

As will become more apparent hereinafter, if there is e.g. a need for sixteen wavelengths, 15 pairs of layers of first and second materials are formed.

It is sufficient to locally eliminate, e.g. by local chemical etching, a pair of layers made from first and second materials in order to modify the effective index and therefore the Bragg wavelength.

More specifically, FIG. 2 diagrammatically illustrates a passive optical guide according to the invention making it possible to obtain four different wavelengths $\lambda 1, \lambda 2, \lambda 3, \lambda 4$.

The optical guide according to the invention diagrammatically shown in FIG. 2 comprises on a substrate 12, a first confinement layer 14 on which is etched a single diffraction grating 16. On the latter is formed a main guidance layer 18 and on said layer 18 there is a stack of layers 20 of a first material of optical index 1 alternating with layers 22 of a second material having an optical index n2 different from n1. These layers 20 and 22 do not necessarily have the same thickness.

As can be seen in FIG. 2, the stack of alternate layers 20 and 22 has been etched so as to represent the steps of a staircase. At one end of the stack, all the layers 20 and 22 remain, whereas at the other end none of the layers 20 and 22 remains. There is a passage from one step to the next on eliminating a pair of layers 20 and 22.

In the embodiment shown in FIG. 2, there are three pairs of layers 20, 22 and therefore three steps and therefore four parallel zones respectively carrying the references 24, 26, 28 and 30, the end zone 24 carrying all the layers 20 and 22, whereas the end zone 30 carries no layer.

These zones 24, 26, 28 and 30 make it possible, in association with the single diffraction grating 16, to form four Bragg gratings and therefore obtain four Bragg wavelengths $\lambda B1, \lambda B2, \lambda B3, \lambda B4$.

Above the staircase stack is formed a second confinement layer 32, which also adopts the shape of said staircase.

It is easy to regulate the spacing between the Bragg wavelengths and therefore between the transmission wavelengths of the lasers by appropriately choosing the thicknesses of the layers 20 and 22 and/or the materials constituting said layers.

It should be noted that epitaxy makes it possible to form material layers with a thickness of 2 nm and the interest of the present invention is immediately apparent for obtaining lasers having desired wavelengths.

Figure 3:
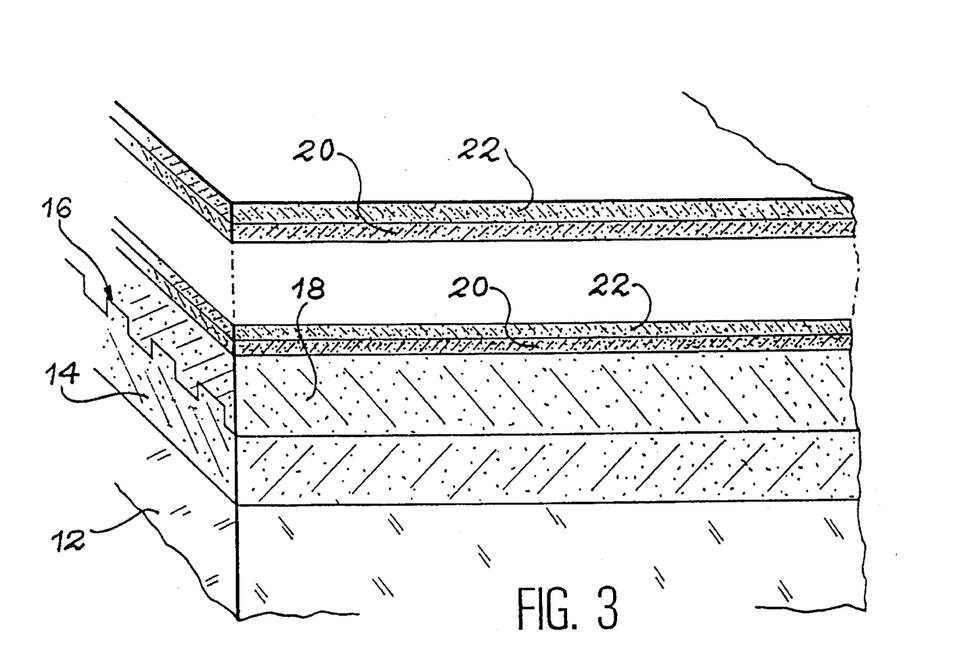
FIG. 3 A diagrammatic view of a semiconductor structure permitting the production of the optical guide according to FIG. 2.

FIG. 3 diagrammatically and partially illustrates a process for the production of an optical guide in accordance with FIG. 2.

On an InP substrate 12 is deposited by epitaxy a first InP confinement layer 14 having an optical index 3.17 and, on said layer 14, is etched a diffraction grating 16 with a predetermined pitch spacing A, e.g. equal to 236.47 nm. In order to do this, preferably use is made of holographic exposure.

On the thus formed diffraction grating 16 is deposited by epitaxy a main InGaAsP guidance layer 18 of optical index 3.4 and thickness 350 nm.

On the layer 18 are then deposited by epitaxy InP layers 20 of optical index 3.17 and a thickness of 5 nm, which alternate with InGaAsP layers 22 of optical index 3.4 and thickness 5 nm.

In a purely informative and non-limitative manner, in order to obtain sixteen laser transmission wavelengths $\lambda 1$ to $\lambda 16$ around 1.54 μm, a stack of 15 pairs of layers 20 and 22 is deposited. This is followed by the formation of the staircase steps referred to hereinbefore, in order to obtain the different parallel zones. For this purpose successive, local chemical etching processes are performed.

For the first local, chemical etching, the complete structure having the layers 20 and 22 is covered with a photosensitive resin layer, the resin is then eliminated, using an appropriate mask, on the portion of the structure which is to be etched and a pair of layers 20 and 22 is removed from said portion by local chemical etching.

The remaining resin is removed, a resin layer is again placed over the entire structure, above the second portion of the structure which it is wished to etch it is eliminated by means of a mask which was displaced, two pairs of layers 20 and 22 being removed in said second portion, etc.

Once the staircase stack has been formed, a vertical and lateral confinement of the optical guide takes place. For this purpose, a confinement material, e.g. InP and having a sufficient thickness for this confinement is deposited and then ridge-type structures are etched in order to define individual light guides respectively corresponding to the various Bragg wavelengths.

As a variant, it is possible to firstly etch the ridge structures and then deposit the confinement material.

With the numerical values given hereinbefore in connection with FIG. 3 and in particular with a diffraction grating with pitch spacings of 236.47 nm, the Bragg wavelengths obtained are as follows:

|  |  |
| --- | --- |
| $\lambda B1 = 1.54000$ μm | $\lambda B9 = 1.53694$ μm |
| $\lambda B2 = 1.53967$ μm | $\lambda B10 = 1.53469$ μm |
| $\lambda B3 = 1.53935$ μm | $\lambda B11 = 1.53601$ μm |
| $\lambda B4 = 1.53899$ μm | $\lambda B12 = 1.53551$ μm |
| $\lambda B5 = 1.53862$ μm | $\lambda B13 = 1.53499$ μm |
| $\lambda B6 = 1.53823$ μm | $\lambda B14 = 1.53445$ μm |
| $\lambda B7 = 1.53780$ μm | $\lambda B15 = 1.53389$ μm |
| $\lambda B8 = 1.53738$ μm | $\lambda B16 = 1.53330$ μm |

The spacing between these wavelengths is not constant, but in order to obtain such a constant spacing, it is merely necessary to progressively increase the thickness of the layers 22.

In order to obtain an optical guide according to the invention, it is possible to proceed in a manner different from that explained with reference to FIG. 3.

It is possible to start by depositing on the substrate the stack of alternate layers 20 and 22 and then form the different zones by etching said stack.

This is followed by the deposition of the main guidance layer on the thus etched stack and on said main guidance layer is formed the diffraction grating, followed by a lateral and vertical confinement of the optical guide.

Obviously, the production process described hereinbefore relative to FIG. 3 and the variant just described will be preceded and followed by various other stages for the manufacture of the actual lasers.

A description will be given hereinafter of other embodiments of the invention relative to the production of multiple Bragg gratings for monofrequency laser transmitters using such gratings. As hereinbefore, it is a question of locally varying the effective index of an optical guide in which is etched a single diffraction grating.

A variation of the Bragg wavelength of the guide results directly from said effective index variation.

In order to obtain the desired, local effective index variation, in each zone corresponding to a Bragg grating adjustment takes place of the number and characteristics of the layers of materials possessed by the optical guide The interest of this aspect of the invention will be illustrated using as an example a laser of the corrugation pitch modulated distributed feedback type, as referred to in document (3).

Figure 4:
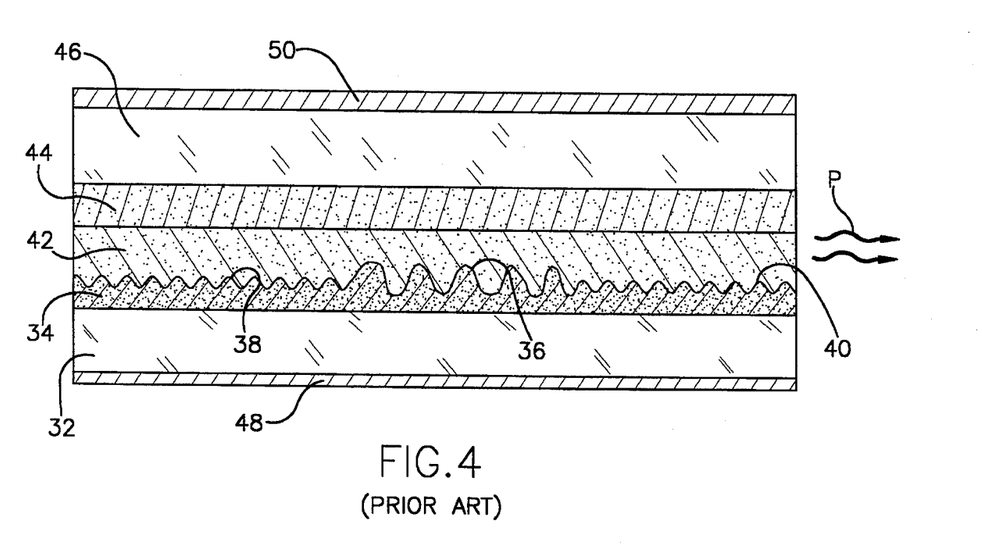
FIG. 4 A diagrammatic view of a known laser of the corrugated pitch modulated distributed feedback type.

FIG. 4 diagrammatically illustrates in longitudinal sectional form (in the light propagation direction P), a known laser of this type.

The laser diagrammatically shown in FIG. 4 comprises a $n^+$ doped InP substrate 32, on which is deposited a $n^+$ doped InP confinement layer 34 and on the latter are formed three diffraction gratings in series, namely a first diffraction grating 36 with a length of 260 μm and a pitch spacing of 239.58 nm and on either side of said grating 36, two diffraction gratings 38 and 40 of the same length 420 μm and the same spacing 239.5 nm.

These diffraction gratings are surmounted by a light guidance zone comprising an InGaAsP layer 42, whose composition corresponds to a spontaneous transmission wavelength of 1.3 μm (reference is more simply made to 1.3 μm InGaAsP), said layer 42 resting on the gratings.

The guidance zone also comprises an active layer 44, which rests on the sublayer 42 and which is of 1.55 μm InGaAsP. The active layer 44 is surmounted by a $p^+$ doped InP confinement layer 46.

A contact 48 (n contact) and a contact 50 (p contact) are respectively formed on the substrate 32 and on the layer 46, as shown in FIG. 4.

Figure 5:
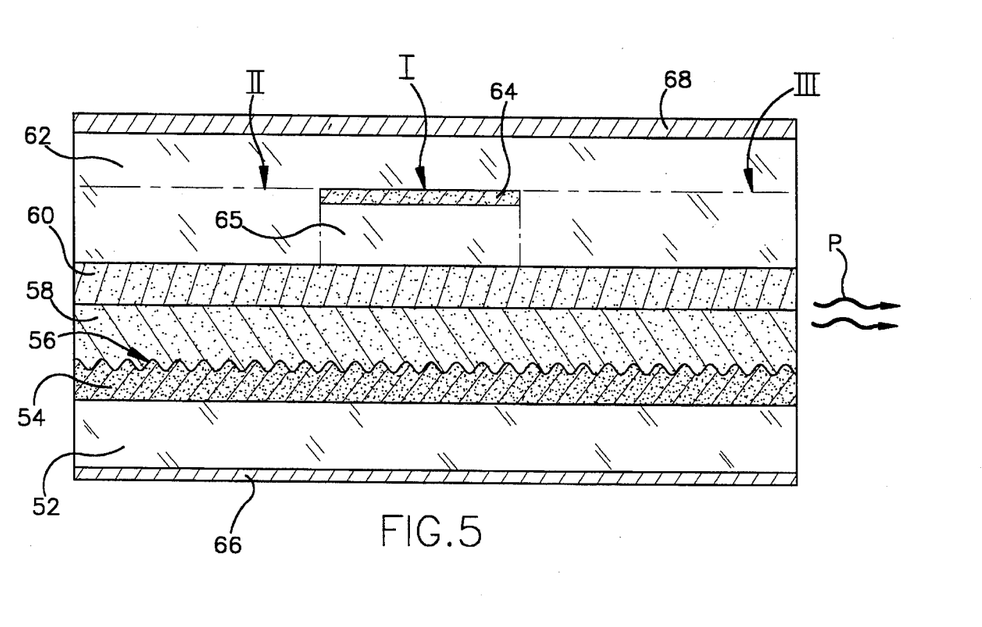
FIG. 5 A diagrammatic view of a laser of this type produced in accordance with the invention.

FIG. 5 is a diagrammatic view in longitudinal section (in the light propagation direction P) of a laser according to the invention of the same type as in FIG. 4, but which is simpler to manufacture.

The laser of FIG. 5 comprises a $n^+$ doped InP substrate 52 on which is formed a first $n^+$ doped InP confinement layer 54 on which is formed a single diffraction grating 56 of pitch spacing A. On said diffraction grating 56 rests a light guidance zone formed from a 1.3 μm InGaAsP layer 58, which is surmounted by a 1.55 μm InGaAsP active layer 60.

The active layer 60 is surmounted by another $p^+$ doped InP confinement layer 62 of optical index 3.17 and, in said layer 62, is inserted a thin layer or film 64 extending parallel to the grating 56 and to the guidance zone, facing a central portion of the diffraction grating 56, as can be seen in FIG. 5.

The thin layer 64 has a thickness of 10 nm and is at a distance of 100 nm from the layer 60.

Said thin layer 64 is of 1.18 μm InGaAsP (i.e., as shown, having a composition corresponding to a spontaneous transmission wavelength of 1.18 μm).

This thin layer 64 should be compared with the diffraction grating 36 of FIG. 4 and a length of 360 μm (counted parallel to P), the layer 62 extending over a length of 420 μm (counted parallel to P) on either side of said thin layer 64.

The laser of FIG. 5 also comprises a contact 66 (n contact) and a contact 68 (p contact) respectively formed on the substrate 52 and on the confinement layer 62, as shown in FIG. 5.

For a transmission of 1.55 μm, the difference between the pitch spacings of the gratings 36 and 38 (or 40) corresponds to an effective index variation of the guide equal to $1.06712 \times 10^{-3}$.

It is the thin layer 64 of optical index 3.3, in association with the 100 nm p$^+$ doped InP thickness 65, which is located below said thin layer 64 making it possible to obtain such an effective index variation.

Thus, like the laser of FIG. 4, the laser of FIG. 5 transmits at 1.55 μm, but with a single diffraction grating and supplementary layers (thin layer 64) and InP thickness 65 located below said layer) make it possible to obtain in the central part of the laser an effective optical index rise.

Thus, definition has taken place of three zones above the layers 58 and 60, namely a zone I having the thickness 65 surmounted by the layer 64 and, on either side of the zone I, two p$^+$ doped InP zones II and III.

Details will be given hereinafter of a process for the production of the laser of FIG. 5.

On the substrate 52 is firstly formed by epitaxy the confinement layer 54, which has the same thickness as its homolog 34 in FIG. 4. This is followed by the etching of the diffraction grating 56.

Successive deposition then takes place by epitaxy of the layer 58 having the same thickness as its homolog 42 in FIG. 4, active layer 60 having the same thickness as its homolog 44 in FIG. 4, a 100 nm thick, p$^+$ doped InP layer and a 10 nm thick, 1.18 μm InGaAsP layer.

The latter layer is then eliminated, except in a central portion of length 360 μm (counted parallel to P) and using chemical etching.

Thus, formation takes place of the three zones I, II and III, referred to hereinbefore and which permit local modifications of the effective optical index of the guide.

This is followed by the lateral confinement of the laser and its vertical confinement is completed. In order to carry out this operation, a longitudinal stripe is etched in the previously obtained structure and said stripe is buried in a p$^+$ InP layer, which completes the vertical confinement and obtains the lateral confinement. This is followed by the production of the contacts 66 and 68.

In a not shown variant of FIG. 5, a thin layer, which is the homolog of the layer 64 in FIG. 5, is inserted in a confinement layer surmounting the substrate, facing the active layer, the diffraction grating then being above a light guidance layer surmounting said active layer.

In order to obtain such a structure, formation takes place on a n$^+$ doped InP substrate of a n$^+$ doped InP confinement layer and on the latter a layer of the same material as the layer 64, which is then eliminated, except in a central portion, as shown hereinbefore, the structure obtained being covered with a n$^+$ doped InP 100 nm thickness, on which is formed the active layer and then on the latter a guidance layer which is the homolog of the layer 58 and the diffraction grating is etched on the latter.

The vertical and lateral confinement of the laser is then completed and its n and p contacts are formed.

I claim:

1. Optical component comprising a light guide with a plurality of Bragg gratings formed therein which respectively have different and predetermined Bragg wavelengths, said light guide including a single diffraction grating and a plurality of stacked zones associated with said diffraction grating to respectively form said plurality of Bragg gratings, said zones having respective optical indices to obtain, in cooperation with said diffraction grating, the Bragg wavelengths, each of said zones inducing a local.modification of the effective optical index of the light guide, and at least one of said zones including a stack of at least two layers of materials having different optical indices.

2. Optical component according to claim 1, wherein said zones form parallel rows, oriented parallel to a light propagation direction in the light guide to obtain parallel Bragg gratings.

3. Optical component according to claim 2, further comprising a main guidance zone in which light is essentially propagated, said main guidance zone contacting said zones, and wherein said zones are alternate stacks of a first layer and a second layer, which respectively made from materials having different optical indices, and said rows having a decreasing number of alternations of the first and second layers from one end row to the other end row.

4. Optical component according to claim 1, wherein said zones form parallel rows, oriented perpendicular to a light propagation direction in the light guide to obtain Bragg gratings in series along a light propagation axis.

5. Process for the production of an optical component comprising a light guide with a plurality of Bragg gratings formed therein which respectively have predetermined Bragg wavelengths, said light guide including a single diffraction grating and a plurality of zones respectively associated with the Bragg gratings, said zones having respective optical indices to obtain, in cooperation with said diffraction grating, the Bragg wavelengths, and each of said zones inducing a local modification of the effective optical index of the light guide, said process comprising the steps of:

(a) forming a light confinement layer (14) on a substrate (12);

(b) forming the diffraction grating (16) on said confinement layer;

(c) forming a main guidance zone (18), intended essentially for the guidance of the light, on said diffraction grating;

(d) alternately stacking on said guidance zone a first layer (20) and a second layer (22) respectively made from materials having different optical indices;

(e) locally eliminating portions of said first and second layers to obtain parallel rows of alternate stacks of the first and second layers, said rows being oriented parallel to a light propagation direction in the light guide and constituting said zones, said rows having a decreasing number of layer alternations from one end row to the other end row; and (f) completing confinement of the light guide.

6. Process according to claim 5, wherein said diffraction grating is formed by a holographic exposure method.

7. Process for the production of an optical component comprising a light guide with a plurality of Bragg gratings formed therein which respectively have predetermined Bragg wavelengths, said light guide including a single diffraction grating and a plurality of zones respectively associated with the Bragg gratings, said zones having respective optical indices to obtain, in cooperation with said diffraction grating, the Bragg wavelengths, and each of said zones inducing a local modification of the effective optical index of the guide, said process comprising the steps of:

(a) forming an alternate stack of a first layer and a second layer respectively made from materials having different optical indices;

(b) locally eliminating portions of said first and second layers to obtain parallel rows of alternate stacks of said first and second layers, said rows being oriented parallel to a light propagation direction in the light guide and constituting said zones, said rows having a decreasing number of layer alternations from one end row to the other end row;

(c) forming a main guidance zone, for essentially guiding the light, on said zones;

(d) forming the diffraction grating on said main guidance zone and (e) completing confinement of the light guide.

8. Process according to claim 7, wherein said diffraction grating is formed by a holographic exposure method.

* * * * *